US007113552B1

(12) United States Patent
Norman et al.

(10) Patent No.: US 7,113,552 B1
(45) Date of Patent: Sep. 26, 2006

(54) PHASE SAMPLING TECHNIQUES USING AMPLITUDE BITS FOR DIGITAL RECEIVERS

(75) Inventors: Charles P. Norman, Huntington Beach, CA (US); Charles R. Cahn, Manhattan Beach, CA (US)

(73) Assignee: SiRF Technology, Inc., San Jose, CA (US)

( * ) Notice: Subject to any disclaimer, the term of this patent is extended or adjusted under 35 U.S.C. 154(b) by 646 days.

(21) Appl. No.: 10/036,788

(22) Filed: Dec. 21, 2001

Related U.S. Application Data

(60) Provisional application No. 60/257,663, filed on Dec. 21, 2000.

(51) Int. Cl.
*H04L 27/22* (2006.01)
(52) U.S. Cl. .................................... 375/316; 375/324
(58) Field of Classification Search ............. 375/147, 375/148, 316, 340, 324–325; 342/357.06, 342/357.12, 417, 458, 463
See application file for complete search history.

(56) References Cited

U.S. PATENT DOCUMENTS

| 4,426,712 A | 1/1984 | Gorski-Popiel |
| 4,445,118 A | 4/1984 | Taylor et al. |
| 4,463,357 A | 7/1984 | MacDoran |
| 4,578,678 A | 3/1986 | Hurd |
| 4,667,203 A | 5/1987 | Counselman, III |
| 4,701,934 A | 10/1987 | Jasper |
| 4,754,465 A | 6/1988 | Trimble |
| 4,785,463 A | 11/1988 | Janc et al. |
| 4,809,005 A | 2/1989 | Counselman, III |
| 4,821,294 A | 4/1989 | Thomas, Jr. |
| 4,862,178 A * | 8/1989 | Sturza et al. ........... 342/357.12 |
| 4,890,233 A | 12/1989 | Ando et al. |
| 4,894,662 A | 1/1990 | Counselman |
| 4,998,111 A | 3/1991 | Ma et al. |
| 5,014,066 A | 5/1991 | Counselman, III |
| 5,036,329 A | 7/1991 | Ando |
| 5,043,736 A | 8/1991 | Darnell et al. |
| 5,108,334 A | 4/1992 | Eschenbach et al. |
| 5,202,829 A | 4/1993 | Geier |
| 5,225,842 A | 7/1993 | Brown et al. |
| 5,293,170 A | 3/1994 | Lorenz et al. |
| 5,311,195 A | 5/1994 | Mathis et al. |
| 5,323,164 A | 6/1994 | Endo |
| 5,343,209 A | 8/1994 | Sennott et al. |
| 5,345,244 A | 9/1994 | Gildea et al. |
| 5,347,536 A | 9/1994 | Meehan |
| 5,379,224 A | 1/1995 | Brown et al. |
| 5,402,347 A | 3/1995 | McBurney et al. |
| 5,416,712 A | 5/1995 | Geier et al. |
| 5,420,593 A | 5/1995 | Niles |
| 5,440,313 A | 8/1995 | Osterdock et al. |
| 5,450,344 A | 9/1995 | Woo et al. |

(Continued)

FOREIGN PATENT DOCUMENTS

EP        0511741        11/1992

(Continued)

*Primary Examiner*—Khanh Tran

(57) ABSTRACT

The present invention uses at least one amplitude bit to assist the phase-sampling technique used in digital receiver architectures. For digital receivers where the Intermediate Frequency (IF) is an integer multiple of the fundamental frequency $f_o$, the present invention provides reduced processing complexity and reduced power consumption. The present invention allows the digital receiver to avoid performing coordinate rotation at high speeds, and replaces such a coordinate rotation with a simple phase subtraction. This replacement of the coordinate rotation allows the receiver to use a less complicated design, and to consume less power as a result.

8 Claims, 1 Drawing Sheet

U.S. PATENT DOCUMENTS

| | | | |
|---|---|---|---|
| 5,504,684 | A | 4/1996 | Lau et al. |
| 5,592,173 | A | 1/1997 | Lau et al. |
| 5,625,668 | A | 4/1997 | Loomis et al. |
| 5,663,734 | A | 9/1997 | Krasner |
| 5,663,735 | A | 9/1997 | Eshenbach |
| 5,781,156 | A | 7/1998 | Krasner |
| 5,786,789 | A | 7/1998 | Janky |
| 5,812,087 | A | 9/1998 | Krasner |
| 5,825,327 | A | 10/1998 | Krasner |
| 5,828,694 | A | 10/1998 | Schipper |
| 5,831,574 | A | 11/1998 | Krasner |
| 5,841,396 | A | 11/1998 | Krasner |
| 5,845,203 | A | 12/1998 | LaDue |
| 5,854,605 | A | 12/1998 | Gildea |
| 5,874,914 | A | 2/1999 | Krasner |
| 5,877,724 | A | 3/1999 | Davis |
| 5,877,725 | A | 3/1999 | Kalafus |
| 5,883,594 | A | 3/1999 | Lau |
| 5,884,214 | A | 3/1999 | Krasner |
| 5,889,474 | A | 3/1999 | LaDue |
| 5,903,654 | A | 5/1999 | Milton et al. |
| 5,907,809 | A | 5/1999 | Molnar et al. |
| 5,917,444 | A | 6/1999 | Loomis et al. |
| 5,920,283 | A | 7/1999 | Shaheen et al. |
| 5,923,703 | A | 7/1999 | Pon et al. |
| 5,926,131 | A | 7/1999 | Sakumoto et al. |
| 5,936,572 | A | 8/1999 | Loomis et al. |
| 5,943,363 | A | 8/1999 | Hanson et al. |
| 5,945,944 | A | 8/1999 | Krasner |
| 5,963,582 | A | 10/1999 | Stansell, Jr. |
| 5,977,909 | A | 11/1999 | Harrison et al. |
| 5,982,324 | A | 11/1999 | Watters et al. |
| 5,987,016 | A | 11/1999 | He |
| 5,999,124 | A | 12/1999 | Sheynblat |
| 6,002,362 | A | 12/1999 | Gudat |
| 6,002,363 | A | 12/1999 | Krasner |
| 6,009,551 | A | 12/1999 | Sheynblat |
| 6,016,119 | A | 1/2000 | Krasner |
| 6,041,222 | A | 3/2000 | Horton et al. |
| 6,047,017 | A | 4/2000 | Cahn et al. |
| 6,052,081 | A | 4/2000 | Krasner |
| 6,061,018 | A | 5/2000 | Sheynblat |
| 6,064,336 | A | 5/2000 | Krasner |
| 6,104,338 | A | 8/2000 | Krasner |
| 6,104,340 | A | 8/2000 | Krasner |
| 6,107,960 | A | 8/2000 | Krasner |
| 6,111,540 | A | 8/2000 | Krasner |
| 6,131,067 | A | 10/2000 | Girerd et al. |
| 6,133,871 | A | 10/2000 | Krasner |
| 6,133,873 | A | 10/2000 | Krasner |
| 6,133,874 | A | 10/2000 | Krasner |
| 6,148,050 | A * | 11/2000 | Holmqvist .................. 375/355 |
| 6,150,980 | A | 11/2000 | Krasner |

FOREIGN PATENT DOCUMENTS

| | | |
|---|---|---|
| GB | 2115195 | 1/1983 |
| JP | 58-105632 | 6/1983 |
| JP | 7-36035 | 5/1986 |
| JP | 4-326079 | 11/1992 |
| WO | WO 90/11652 | 10/1990 |

* cited by examiner

PHASE SAMPLING TECHNIQUES USING AMPLITUDE BITS FOR DIGITAL RECEIVERS

CROSS-REFERENCE TO RELATED APPLICATIONS

This application claims priority under 35 U.S.C. § 119(e) of United States Provisional Patent Application No. 60/257,663, filed Dec. 21, 2000, entitled "PHASE SAMPLING TECHNIQUES USING AMPLITUDE BITS FOR DIGITAL RECEIVERS," by Charles Norman et al, which application is incorporated by reference herein.

BACKGROUND OF THE INVENTION

1. Field of the Invention

The present invention relates in general to digital receivers, and in particular to a method and apparatus for phase sampling using amplitude bits for Global Positioning System (GPS) receivers.

2. Description of the Related Art

Digital receivers are typically very complex devices that locate weak signals in sometimes difficult signal acquisition environments. Currently, federal government mandates for and interest in producing digital receivers, specifically digital GPS receivers, that are compatible with cellular telephones stems from a new Federal Communications Commission (FCC) requirement that cellular telephones be locatable within 20 feet once an emergency call, such as a "911" call (also referred to as Enhanced 911 or "E911") is placed by a given cellular telephone. Such position data assists police, paramedics, and other law enforcement and public service personnel, as well as other agencies that may need or have legal rights to determine the cellular telephone's position. Further, GPS data can be used by the cellular user for directions, location of other locations that the cellular user is trying to locate, determination of relative location of the cellular user to other landmarks, directions for the cellular user via internet maps or other GPS mapping techniques, etc. Such data can be of use for other than E911 calls, and would be very useful for cellular and PCS subscribers.

Typically, digital receivers use a phase-sampling technique to detect zero crossings of the incoming signal, and attempt to align or correlate these zero crossings with a local oscillator or crystal. This allows the receiver to "lock" onto the received signal and use the signal for tracking, position determination, and other information. However, the use of phase information alone makes the correlation between the incoming signal and the reference signal difficult and more time-consuming, which could leave an E911 caller in a dangerous situation longer than necessary. Further, the typical phase-sampling technique requires significant power consumption for smaller, hand-held devices such as cellular telephones.

Further, digital receivers are sometimes used in environments where Continuous Wave (CW) jamming is occurring, such as battlefields, congested signal areas such as airports, etc. CW jamming will degrade the receiver performance of the digital receiver, sometimes to the point where the digital receiver can no longer receive signals with any reliability. This could be dangerous for E911 callers that were unfortunate enough to be stranded in a location that is within a CW jamming area, as well as being potentially deadly for soldiers that are in a CW jamming area.

It can be seen, then, that there is a need in the art for a method and apparatus for improved phase-sampling techniques that can reduce the complexity of the digital receiver circuitry. It can also be seen that there is a need in the art for reducing the power consumption for phase-sampling and correlating within the digital receiver. It can also be seen that there is a need in the art for integrating GPS and cellular devices in such a manner that reduces the time required to obtain position information. It can also be seen that there is a need in the art for a method and apparatus that can help overcome CW jamming problems for digital receivers.

SUMMARY OF THE INVENTION

To minimize the limitations in the prior art, and to minimize other limitations that will become apparent upon reading and understanding the present specification, the present invention discloses a method and apparatus for phase sampling using amplitude bits for Global Positioning System (GPS) receivers. The phase sampling allows the digital receiver to avoid complex multiplication and instead performing a phase subtraction to derotate the phase of the incoming signal.

A method in accordance with the present invention comprises downconverting the incoming signal to an Intermediate Frequency (IF) signal, running a counter at a higher frequency than that of the Intermediate Frequency (IF) signal, outputting a state of the counter when the IF signal has a zero crossing, outputting a state of a magnitude of the IF signal when the IF signal has a zero crossing; and extracting the phase of the IF signal from the outputted state of the counter and the outputted state of the magnitude.

It is an object of the present invention to provide a method and apparatus for improved phase-sampling techniques that can reduce the complexity of the digital receiver circuitry. It is a further object of the present invention to provide a method and apparatus for reducing the power consumption for phase-sampling and correlating within the digital receiver. It is a further object of the present invention to provide a method and apparatus for integrating GPS and cellular devices in such a manner that reduces the time required to obtain position information. It is another object of the present invention to provide a method and apparatus that can help overcome CW jamming problems for digital receivers.

BRIEF DESCRIPTION OF THE DRAWINGS

Referring now to the drawings in which like reference numbers represent corresponding parts throughout.

DETAILED DESCRIPTION OF THE DRAWINGS

Figure 1:
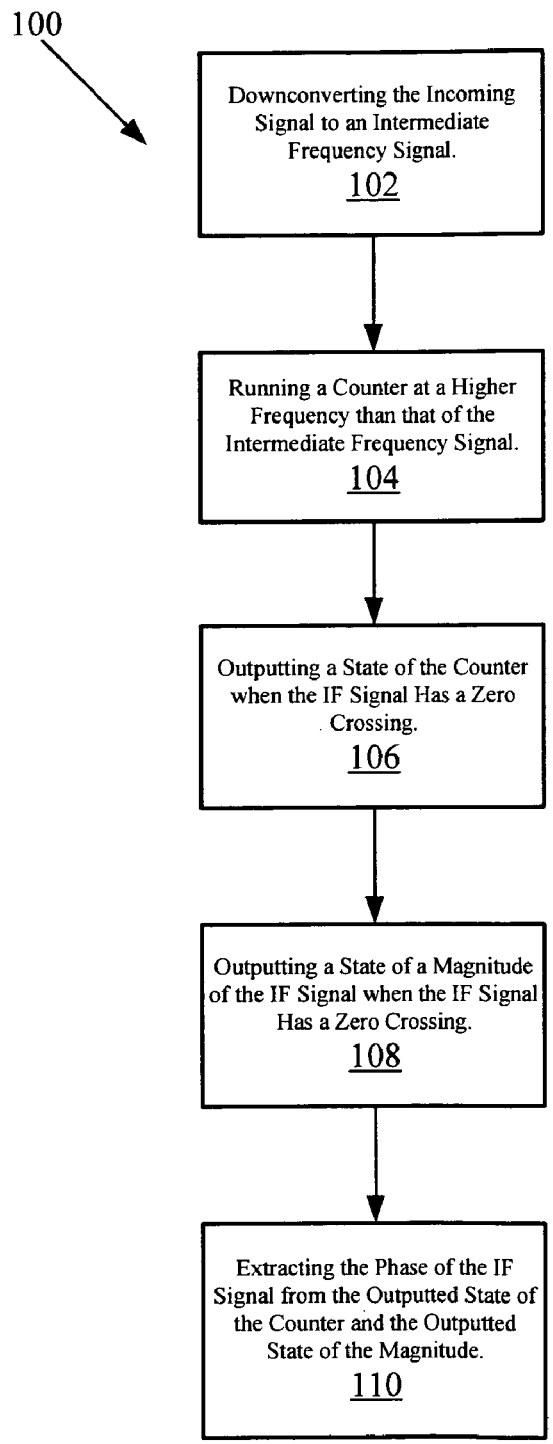
FIG. 1 illustrates a flow chart illustrating one embodiment of steps that can be used in practicing the present invention.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention uses at least one amplitude bit to assist the phase-sampling technique used in digital receiver architectures. Although described herein as applying to GPS receivers, the present invention can be used with any digital receiver that uses phase-sampling.

Phase-sampling in digital receivers typically samples zero crossings at the Nyquist rate (i.e., the predetection bandwidth) to extract the phase of a narrow band signal with respect to an arbitrary reference. Such a technique is described in "Digital Phase Sampling for Microcomputer Implementation of Carrier Acquisition and Coherent Tracking" by Cahn, which is incorporated by reference herein.

For some GPS receiver frequency plans, and other digital receivers where the Intermediate Frequency (IF) is a small integer multiple of the fundamental frequency $f_o$, the present invention provides reduced processing complexity and reduced power consumption. The present invention works well with larger integer multiples of the fundamental frequency $f_o$, with less dramatic improvements. The present invention allows the digital receiver to avoid performing coordinate rotation at high speeds, and replaces such a coordinate rotation with a simple phase subtraction. This replacement of the coordinate rotation allows the receiver to use a less complicated design, and to use lower power as a result.

The present invention, in essence, enables the Doppler rotation performed in the digital receiver to be done by a simple subtraction of the phase estimate and, thereby, can simplify the implementation of a digital receiver. The simplification of the receiver circuitry reduces the time it takes the receiver to perform the required tasks, and reduces the power that the receiver consumes. However, typical phase sampling techniques do not use any information about the magnitude of the IF signal, whereas the present invention uses a quantized magnitude (one bit=two magnitude levels), where the magnitude can be quantized to one or more bits.

Further, with respect to CW jamming tolerance, the present invention provides improved performance. The basic phase-sampling technique without any magnitude quantization is essentially equivalent to a bandpass hard limiter, which is well known to cause a 6-dB degradation with CW jamming. On the other hand, 2-bit quantization of the I and Q samples is expected to give a small enhancement against CW jamming. Additional information about digital receiver performance in CW jamming environments can be found in F. Amoroso, "Adaptive A/D Converter to Suppress CW Interference in DSPN Spread-Spectrum Communications," IEEE Trans on Comm, Vol COM-31, October 1983, pp 1117–1123, which is incorporated by reference herein.

The Phase-Sampling Concept

The phase-sampling concept of the present invention extracts the phase values from the zero-crossings of the bandpass signal in the IF. A counter runs at a multiple M of the IF, and zero crossing causes the state of this counter to be output. If the outputted state is the integer J, the extracted phase of the IF signal is $-2\pi J/M$ rad. The Doppler rotation subtracts the estimated phase from the extracted phase, and a table lookup of cosine and sine of the phase difference provides the in-phase and quadrature components for digital correlation. Biphase Correlation only has to be done once by shifting the phase estimate by $\pi$. Typically, the estimated phase is quantized to a power of 2, also M is typically a power of 2, so Biphase correlation simply complements the MSB. Having a fixed clock rate, the most recent extracted phase is the output at each clock.

For an $IF=4f_o$, running the counter at $32f_o$ quantizes the extracted phase to 8 sectors, or 3 bits. Two envelope levels gives a total of 4 bits per output sample, where the output clock rate is $2f_o$. Running the counter at $64f_o$ would quantize the extracted phase to 4 bits. Other combinations of IF and counter speeds can be used without departing from the scope of the present invention.

Basic Simulation of the Phase-Sampling Technique

A basic simulation generates samples of the complex signal with a random phase plus Gaussian noise with unit variance, quantizes the noisy phase, defined by the $\tan^{-1}(Q/I)$, to 3 bits and the envelope to 1 bit, subtracts the true phase, and computes correlation by taking the cosine of the phase difference. A Monte Carlo evaluation of the mean and variance of the correlation determines that the correlation loss is about 0.6 dB, using the quantized envelope magnitudes 1 and 2 and setting the envelope quantizing threshold to 1.5.

GPS System Simulation

A simulation of a GPS system implementing the present invention was performed. Signals were generated at a complex sampling rate of $32f_o$. After the Butterworth IF filter in the GPS receiver, the complex signal is phase rotated at the IF frequency of $4f_o$, which means phase rotation by $\pi/4$ per sample. The real part of the complex signal is the bandpass IF signal, and a zero crossing is detected when a positive sample follows a negative sample in the real IF signal.

As an implementable approximation to quantizing the actual envelope, the magnitude bit for each extracted phase sample is set to 1 if the absolute value of the real signal exceeded a threshold at any time subsequent to the occurrence of the previous zero crossing. The threshold is set to give the same probability of the higher magnitude as determined above in the basic simulation; this is $e^{-1.5^2/2}=0.32$. The two envelope magnitudes are 1, 2.

The output sampling rate is $2f_o$, and the oscillator is offset by 80 KHz in the simulation. This means the chip rate is offset by 80 KHz/1540=51.95 chips/sec. Therefore, the chip timing in the received signal displaces at a slow uniform rate relative to the output samples in the receiver (asynchronous sampling). Also, the true carrier phase of the received signal is rotating relative to the receiver's IF.

The cosine lookup table for the digital correlation is quantized to 16 phase sectors with the same amplitude quantization as in the existing Doppler rotation.

Simulation Results

With a 4-pole Butterworth IF filter of bandpass $2f_o$ and an output sampling rate of $2f_o$, which is compatible with the multiple correlators of existing GPS receiver architectures, the output S/N of a system implementing the present invention is measured to be 1.2 dB at $C/N_o=30$ dB-Hz for a 1-msec coherent integration (punctual correlation over 1023 PN chips). An ideal system with no losses would yield output S/N=3 dB, so the total system degradation is 1.8 dB, which includes IF filtering loss, the loss of the phase-sampling technique, and the loss due to the asynchronous sampling. The estimated timing of the PN replica and the estimated carrier phase shift were empirically adjusted to maximize the punctual correlation.

If the IF bandpass=$4f_o$ but the output sampling rate is still $2f_o$, the output S/N=−1.5 dB for the phase-sampling technique. The greater degradation is due to the noise aliasing caused by the wider IF bandpass.

For comparison, simulation of an existing GPS receiver architecture with oversampling at the sampling rate of $16f_o$ with quantization to 2 bits of I and 2 bits of Q, decimation to an output sampling rate of $2f_o$ with requantization to 2 bits, and 4-bit Doppler rotation with requantization to 2 bits yields an output S/N of 0.45 dB using an IF bandpass of 6

MHz. As can be seen, the present invention can improve the output S/N of the receiver by approximately 1.35 dB.

CW Jamming

An important performance area of concern with phase sampling is the tolerance of CW jamming. The basic phase-sampling technique without any magnitude quantization causes a 6-dB degradation with CW jamming. The present invention provides performance enhancement over the systems of the related art as shown in the simulations herein.

Magnitude Quantization with Phase Sampling

As described above, the magnitude of the phase is quantized to the higher value if the instantaneous value of the IF waveform exceeds a threshold during the time interval between successive zero crossings. The quantized magnitude multiplies the cosine or sine of the phase error obtained by differencing the sampled phase and the carrier phase estimate in the receiver. The cosine or sine value is obtained by a table lookup. The two quantized magnitude values are related by a factor of 2, and the magnitude-quantizing threshold is set to give the probability of getting the higher magnitude equal to approximately 0.32, found to be optimum for Gaussian noise.

Simulation Parameters for CW Jamming

For an IF of $4f_o$, where $f_o$=1.023 MHz, the GPS C/A code chip rate, and the clock rate for the counter is $32f_o$, thereby quantizing the phase sample to eight sectors per cycle, or 3 bits. Including the magnitude quantization, this is a total of 4 bits per sample. The sampling rate is two samples per C/A code chip, and the 3-dB bandpass of the 4-pole Butterworth IF filter is 2.046 MHz to match the phase-sampling rate. There are 1023 chips per coherent integration (1 msec), but the C/A code in the simulation is random rather than an actual periodic GPS C/A code to eliminate artifacts of code periodicity, such as greater degradation when the CW jamming frequency falls directly on a code spectral line. The CW jamming has a constant magnitude and a frequency slightly offset from the IF center frequency. The simulation measures the mean and standard deviation of the correlation when the PN replica code and the phase estimate are adjusted to maximize the correlation. As typical in GPS receivers, the carrier frequency of the GPS signal is slightly offset from the IF center frequency by 80 KHz with a proportional offset of the chip rate.

The magnitude-quantizing threshold is set with CW jamming to give the same probability of getting the higher magnitude as is optimum for Gaussian noise. A different threshold setting can improve performance against CW jamming even more than described herein.

Simulation Results

Typical GPS signals are received at $C/N_o$=40 dB-Hz. The output S/N is defined as the mean of coherent correlation divided by the standard deviation, where the estimated phase in the receiver is adjusted to maximize the correlation mean. The J/S of the CW jamming is increased until the output S/N approximately corresponds to the value expected at a much lower $C/N_o$ in the absence of the CW jamming. It is found that the output S/N=–0.8 dB at J/S=35 dB. Approximately the same output S/N is obtained at $C/N_o$=28 dB-Hz in the absence of the CW jamming.

To assess the benefit of the present invention which incorporates one-bit quantization of magnitude with the phase-sampling technique, the quantized magnitude in the simulation was temporarily held constant. As already discussed, for Gaussian noise only in the absence of the CW jamming, the required $C/N_o$ must increase by approximately 1 dB to maintain the same output S/N with a constant magnitude as with the one-bit magnitude quantization. The benefit of the magnitude quantization is more significant against CW jamming. At $C/N_o$=40 dB-Hz, the J/S to give the same output S/N with the constant magnitude as with the one-bit magnitude quantization decreased from 35 dB to 28 dB. Therefore, the one-bit quantization of magnitude is found to improve the tolerance to CW jamming of the phase-sampling technique by 7 dB.

Comparison between the present invention and a typical GPS system was made by performing a simulation for a system using 2-bit I and Q quadrature sampling at $16f_o$ decimated to two samples per C/A chip. Assuming the same IF filter as the above and setting the probability of getting the higher quantization level equal to 0.33 with 1:4 weighting of the two quantization levels, it is found that the output S/N=–0.9 dB with $C/N_o$=40 dB-Hz and J/S=32 dB. Thus, the present invention has a higher tolerance to CW jamming compared to typical systems by a 3 dB margin.

Process Chart

FIG. 1 illustrates a flow chart illustrating a first set of steps that can be used to practice the present invention.

Diagram 100 includes several steps 102–110 that illustrate a first embodiment of the present invention. Other steps can be used within the scope of the present invention to achieve the same results.

Block 102 illustrates downconverting the incoming signal to an intermediate frequency (IF) signal.

Block 104 illustrates running a counter at a higher frequency than that of the intermediate frequency signal.

Block 106 illustrates outputting a state of the counter when the IF signal has a zero crossing.

Block 108 illustrates outputting a state of a magnitude of the IF signal when the IF signal has a zero crossing. The state of the magnitude can be determined by using an accumulator, a peak value detector, an analog-to-digital converter, or other methods or devices that determine the overall magnitude of the IF signal.

Block 110 illustrates extracting the phase of the IF signal from the outputted state of the counter and the outputted state of the magnitude.

Some alternatives to the steps shown in blocks 102–110 are to hold a state of the counter when the IF signal has a zero crossing, and hold a magnitude bit that is set to 1 if an absolute value of the real signal exceeded a threshold prior to an occurrence of a previous zero crossing. Further enhancements to blocks 102–110 comprise applying the methods of the present invention to a Global Positioning System (GPS) receiver, performing the phase extraction by subtracting an estimated phase from the extracted phase of the IF signal, running the counter at an integer multiple of the IF, determining the extracted phase using an equation, determining the state of a magnitude using a digital state, and having that digital state be at least two bits long.

CONCLUSION

In summary, the present invention provides methods and apparatuses for quantizing the magnitude of the IF signal to assist with the phase-sampling technique. This allows phase subtraction to replace Doppler rotation in the digital receiver, malting the receiver less complex, allows the receiver to consume less power, and provide equivalent or better performance.

A method in accordance with the present invention comprises downconverting the incoming signal to an Intermediate Frequency (IF) signal, running a counter at a higher frequency than that of the Intermediate Frequency (IF) signal, outputting a state of the counter when the IF signal has a zero crossing, outputting a state of a magnitude of the IF signal when the IF signal has a zero crossing; and extracting the phase of the IF signal from the outputted state of the counter and the outputted state of the magnitude.

Another method in accordance with the present invention comprises downconverting the incoming signal to an Intermediate Frequency (IF) signal, running a counter at a higher frequency than that of the Intermediate Frequency (IF) signal, holding a state of the counter when the IF signal has a zero crossing, holding a magnitude bit that is set to 1 if an absolute value of the real signal exceeded a threshold prior to an occurrence of a previous zero crossing, and extracting the phase of the IF signal from the state of the counter and the state of the magnitude bit.

The phase-sampling technique of the present invention gives good performance, comparable or even better than that of the existing digital receiver and/or GPS receiver architectures. Certain implementations of the present invention require the IF bandpass be matched to the output sampling rate. Because the real IF signal is examined for a zero crossing at a relatively high sampling rate, the phase-sampling technique of the present invention can be viewed as a form of decimation to a lower output sampling rate. A potential disadvantage is that a wide IF bandpass degrades performance of the phase-sampling technique because of the noise aliasing.

The one-bit quantization of magnitude used in conjunction with the phase-sampling technique, as described by the present invention, improves the tolerance to CW jamming by 7 dB. Furthermore, the phase-sampling technique with the one-bit quantization of magnitude of the present invention enables tolerating 3 dB higher J/S than typical implementations that use 2-bit quantization of I and Q with decimation and quantized phase rotation.

Additional quantizations, e.g., two-bit quantizations, three-bit quantizations, etc. in accordance with the present invention can provide additional benefits over the simulations shown herein.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description, but by the claims appended hereto.

What is claimed is:

1. A method for phase sampling an incoming signal in a digital receiver, comprising:
    downconverting the incoming signal to an Intermediate Frequency (IF) signal;
    running a counter at a higher frequency than that of the Intermediate Frequency (IF) signal;
    outputting a state of the counter when the IF signal has a zero crossing,
    outputting a state of a magnitude of the IF signal when the IF signal has a zero crossing; and
    extracting the phase of the IF signal from the outputted state of the counter and the outputted state of the magnitude.

2. The method of claim 1, wherein the digital receiver is a Global Positioning System (GPS) receiver.

3. The method of claim 2, wherein the phase extraction is performed by subtracting an estimated phase from the extracted phase of the IF signal.

4. The method of claim 3, wherein the counter is running at a frequency that is an integer multiple of the IF.

5. A method for phase sampling an incoming signal in a digital Global Positioning System (GPS) receiver, comprising:
    downconverting the incoming signal to an Intermediate Frequency (IF) signal;
    running a counter at a higher frequency than that of the Intermediate Frequency (IF) signal and at an integer multiple of the IF;
    outputting a state of the counter when the IF signal has a zero crossing,
    outputting a state of a magnitude of the IF signal when the IF signal has a zero crossing; and
    extracting the phase of the IF signal from the outputted state of the counter and the outputted state of the magnitude, wherein the phase extraction is performed by subtracting an estimated phase from the extracted phase of the IF signal and the extracted phase of the IF signal is given by:
    $-2\pi J/M$ radians,
where M is the integer multiple of the IF, and J is the outputted state of the counter.

6. The method of claim 5, wherein the state of the magnitude of the IF signal is a digital state.

7. The method of claim 6, wherein the digital state is at least two bits.

8. A method for phase sampling an incoming signal in a digital receiver, comprising:
    downconverting the incoming signal to an Intermediate Frequency (IF) signal;
    running a counter at a higher frequency than that of the Intermediate Frequency (IF) signal;
    holding a state of the counter when the IF signal has a zero crossing;
    holding a magnitude bit that is set to 1 if an absolute value of the IF signal exceeded a threshold prior to an occurrence of a previous zero crossing; and
    extracting the phase of the IF signal from the state of the counter and the state of the magnitude bit.

* * * * *